219-121. SR 11-02-71 OR 3,617,684

United States Patent

[11] 3,617,684

[72] Inventor Alfonso Di Mino
Woodcliff Lake, N.J.

[21] Appl. No. 13,697
[22] Filed Feb. 24, 1970
[45] Patented Nov. 2, 1971
[73] Assignee Datapax Computer Systems Corporation
New York, N.Y.

[54] ELECTRONIC TRIMMING OF MICROELECTRONIC RESISTORS

4 Claims, 6 Drawing Figs.

[52] U.S. Cl. .......... 219/121 R, 29/620, 250/49.5
[51] Int. Cl. .......... B23k 15/00
[50] Field of Search .......... 250/49.5 GE, 49.5 T, 49.5 TE, 41.9; 219/121 R; 29/620

[56] References Cited

UNITED STATES PATENTS

| | | | |
|---|---|---|---|
| 2,752,533 | 6/1956 | Maas | 317/2 |
| 3,244,855 | 4/1966 | Cauley | 219/121 |
| 3,411,203 | 11/1968 | Pakulski et al. | 29/620 |
| 3,436,515 | 4/1969 | Sayer et al. | 219/121 |
| 3,440,418 | 4/1969 | Piazza | 250/49.5 |
| 3,457,636 | 7/1969 | Ireland et al. | 29/62 |

*Primary Examiner*—J. V. Truhe
*Assistant Examiner*—Robert E. O'Neill
*Attorney*—Michael Ebert

ABSTRACT: An electronic technique for changing the ohmic values of microelectronic resistors formed on a substrate, so as to either increase or decrease the values thereof without affecting their physical qualities. To bring about a decrease in value, the surface of the resistor is subjected to a corona discharge produced by radiofrequency energy having a low-frequency amplitude modulation component. The same energy source is used to effect an increase in ohmic value, this being effected by passing a heating current through the body of the resistor.

PATENTED NOV 2 1971 3,617,684

INVENTOR.
ALFONSO DIMINO
BY
ATTORNEY

ELECTRONIC TRIMMING OF MICROELECTRONIC RESISTORS

BACKGROUND OF INVENTION

This invention relates generally to microelectronics, and more particularly to an electronic technique for trimming the values of resistors incorporated in microelectronic structures without, however, affecting the physical dimensions of the resistors.

Microelectronics is that branch of the electronics art which deals with extremely small components, assemblies or systems. In one well-known form of microelectronic structure, resistors, capacitors and conductors are formed by depositing chemical materials onto the surface of a substrate to define a "thin-film" circuit. In another form, a substrate is also employed, but resistors and conductors are printed onto its surface, all other circuit components, such as capacitors, diodes, etc., being discrete elements. This type of microelectronic structure is known as a "thick-film" or a ceramic printed circuit.

Ceramic printed circuits are the main concern of the present invention, for these may be inexpensively mass produced, and, because of their compactness, lightweight and low cost, they are widely used in many forms of modern electronic equipment. In the fabrication of ceramic printed circuits, the circuit pattern is printed on a high-resolution metal screen. In separate operations, the conductor and resistor materials are pressed through the screen onto a wafer-thin substrate of alumina or other ceramic. The resistive materials are generally in the form of carbon particle dispersed in a binder solution. Use is also made of such resistive materials in particulate form as nichrome, tin oxide, cermet and titanium.

After the conductor and resistor patterns have been printed, the ceramic wafer is placed first in a low-temperature oven which dries the pattern, and then in a high-temperature furnace which fixes the resistor and conductor patterns on the substrate. Next, the conductors are dip soldered and additional components, such as transistors and capacitors, are soldered, welded or bonded to the substrate. In a final step, the substrate is encapsulated.

While this fabrication technique gives rise to resistance values which are fairly close to the required tolerances, it is still necessary to make a final adjustment, for it is not possible to lay down precision resistors. With existing trimming methods, one percent tolerance is achievable by the physical removal of resistive material embedded in the resistor deposit following the firing cycle. Removal of this material from the edge of the printed resistor by an air-operated abrasion unit gives positive control of precision resistance values.

Nevertheless, the abrasion technique for trimming resistors has many serious drawbacks, for it not only degrades or destroys the physical qualities of the resistors, but it also reduces their physical dimensions, with an accompanying loss in power-handling capacity. Moreover, the abrasion technique is capable only of effecting an increase in resistance value so that if the resistor value, as printed, is initially too high, it is not correctable and the resistor must be rejected.

In projecting a jet of sand or other abrasive material against the resistor surface, it is difficult to control the degree of attrition, as a consequence of which the ohmic value may be caused to rise beyond the desired tolerance. Since correction can only be effected unidirectionally, in the event the trimming action overshoots the desired value, the resistor is no longer correctable and must be rejected. Thus, printed resistors which initially are too high in value or which have been excessively trimmed are beyond correction with existing abrasion-trimming techniques.

A single defective resistor in a ceramic printed circuit renders the entire circuit unacceptable and a mistake in trimming one resistor in a printed circuit assembly makes it necessary to reject the entire circuit. The likelihood of a single error is particularly great when the assembly includes a large number of resistors such as in a ladder network. In practice, therefore, with existing abrasion-trimming techniques, the rejection rate is quite high. This factor raises manufacturing costs substantially.

SUMMARY OF INVENTION

In view of the foregoing, it is the primary object of the invention to provide an electronic technique for trimming the ohmic value of a printed resistor included in a microelectronic circuit, to effect a reliable and predictable correction in either direction with respect to the initial value of the resistor.

More specifically, it is an object of this invention to provide an electronic trimming technique which subjects the resistor to high-frequency energy having a low-frequency modulation component to effect a decrease or increase in ohmic value without any change in the physical dimensions of the resistor.

Among the advantages of the invention are the following:

A. No mechanical grinding action takes place, the value of the resistor being altered without degrading its physical properties or reducing its power-handling capacity;

B. The electronic technique makes it possible to reduce the value of a resistor whose initial value is too high, as well as to increase the value of a resistor which initially is too low, so that an ultimate value may be attained within the desired tolerance regardless of the initial polarity or error;

C. The electronic technique effects important economies in production, for it gives rise to a markedly reduced rejection rate;

D. The electronic technique is capable of modifying resistance values even after the resistor has been protectively overcoated;

E. The electronic trimming procedure involves relatively low-power, high-frequency energy and produces no carbon dust or sand, its use being in no way injurious to the health or safety of the operator;

F. Because the electronic technique neither increases nor decreases the physical dimensions of the printed resistor, it makes it feasible to correct the value of low-power-handling resistors of low ohmic value, which resistors may easily be damaged or destroyed when subjected to the abrasion technique.

Also an object of the invention is to provide a simple and efficient electronic trimming technique which is adapted to correct the value of a printed resistor to any required accuracy or tolerance, for the technique makes it possible to effect minute ohmic changes not attainable with mechanical abrasion.

Briefly stated, these objects are attained by means of a low-power, radiofrequency source whose high-frequency carrier is amplitude-modulated by an audiofrequency signal to generate a pulsatory RF carrier. The resonator of the source is inductively coupled to a step-up coil connected to a "Down" probe which, when brought close to a point on the resistor, produces a corona discharge acting to reduce the value of the resistor. The source resonator is also inductively coupled by a step-down coil connected to an "Up" probe which, when brought into contact with Xa point on the resistor, produces a current flow therein acting to increase the value of the resistor. The extent of ohmic change is determined by the duration of high-frequency treatment and by the area of the resistor subjected to treatment.

OUTLINE OF DRAWING

For a better understanding of the invention as well as other objects and further features thereof, reference is made to the following detailed description to be read in conjunction with the accompanying drawing, wherein.

DESCRIPTION OF INVENTION

Figure 1:
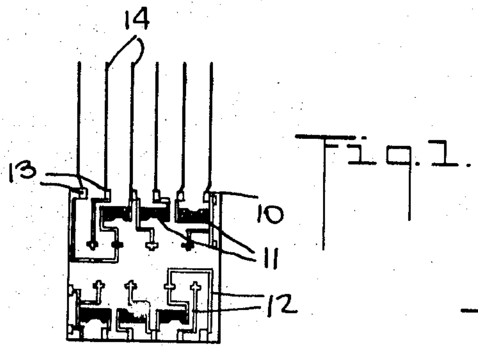
FIG. 1 is a plan view of a typical ceramic printed circuit after being subjected to abrasion trimming.

Referring now to FIG. 1, there is shown a typical microelectronic structure of the thick-film or ceramic printed circuit type. The structure includes a ceramic substrate 10 on which there are printed various resistors 11, connected by printed conductors 12 to terminals 13 having leads 14 soldered thereto.

Resistors 11 are printed so as to assume rectangular forms. However, when the resistors are trimmed by the conventional abrasion technique, material is mechanically removed from the edge of the resistors, so that their physical form and integrity are seriously eroded. The many drawbacks incident to this technique have been previously pointed out, and will not therefore be repeated.

Figure 2:
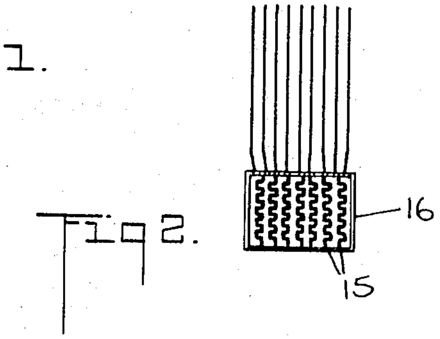
FIG. 2 is a plan view of another typical ceramic printed circuit which cannot be safely trimmed using standard abrasion trimming techniques.

In many instances, in order to provide relatively long resistance paths within a limited area, the resistors are printed in periodic or meandering wave patterns, as shown in FIG. 2 where a bank of parallel resistors 15 are printed on a ceramic substrate 16. Since the resistance path of each of these elements is relatively narrow, should an attempt be made to trim these resistors using the standard abrasion technique, there is a strong likelihood that abrasion will cause a break in the path and thereby open circuit the resistor. Hence in ladder networks and in other circuits which incorporate a concentrated number of resistors having narrow dimensions, it is extremely difficult to avoid damaging the resistor in the course of abrasion trimming.

Figure 3:
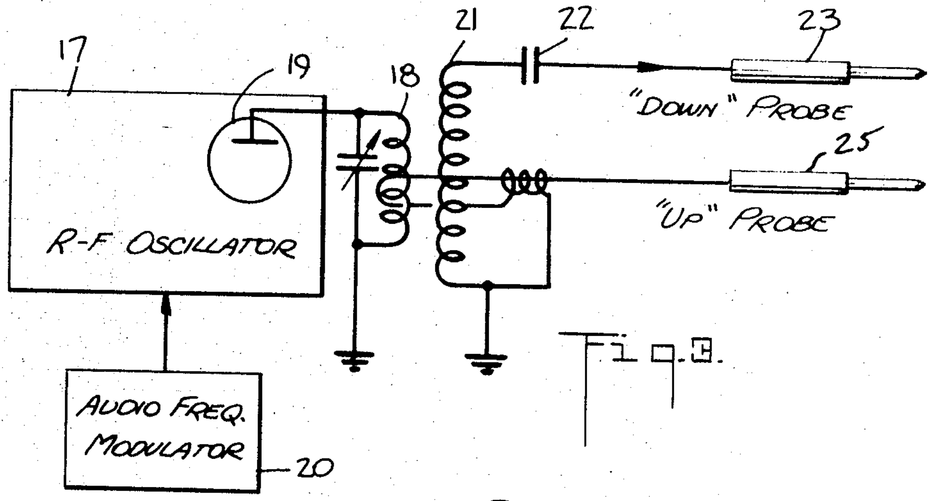
FIG. 3 is a schematic diagram of a modulated high-frequency electronic trimmer apparatus in accordance with the invention.

The present invention obviates the use of mechanical grinding or attrition and effects trimming by an electronic action which alters the resistive value without a change in physical dimensions. The apparatus used for this purpose is shown in FIG. 3 and it includes a radiofrequency oscillator, represented by block 17, preferably operating in the range of about 800 to 1,000 kilohertz, with a power output of no greater than about 5 to 10 watts.

Because of the low power involved, the system presents very little danger to operating personnel. In practice, the oscillator may be a conventional Hartley oscillator having a tunable resonator 18 associated with power tube 19. Any known form of RF oscillator may be used.

Figure 4:
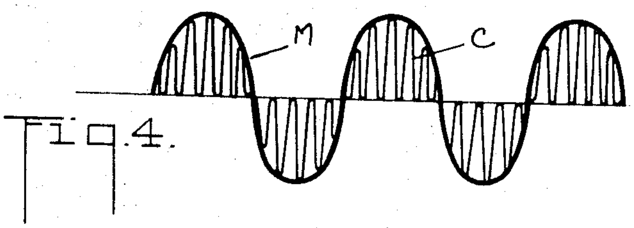
FIG. 4 illustrates the wave form of the output of the trimmer apparatus.

Oscillator 17 is amplitude-modulated by an audiofrequency generator 20, preferably operating in a range of 2,000 to 3,000 Hz. Thus the output of the oscillator, as indicated in FIG. 4, is an RF carrier C, having a low-frequency amplitude-modulation component M imposed thereon. Consequently the RF output is effectively pulsatory in character. It has been found that while an unmodulated RF creates changes in resistance value, these changes are not readily controllable, whereas with a pulsatory RF source of the type disclosed herein, the repetitive shock action of the RF energy makes it possible to realize predictable changes in ohmic value.

Inductively coupled to resonator 18 of the oscillator is a voltage step-up multiturn coil 21 which is coupled through a capacitor 22 to a "Down" probe 23, so called because it serves to decrease or bring down the value of the resistor. Inductively coupled to resonator 18 and coil 21 is a single-turn "blind" coil 24 which is connected to an "Up" probe 25, so called because it serves to increase or bring up the value of the resistor.

Figure 5:
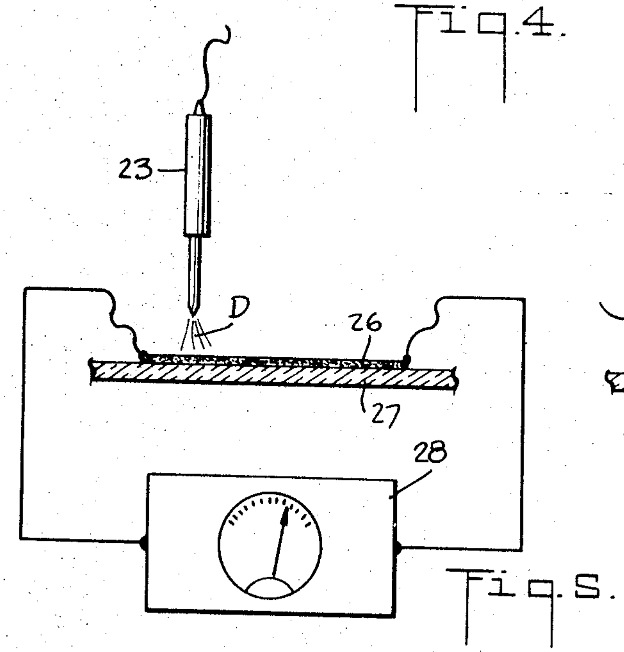
FIG. 5 illustrates the manner of using the apparatus to decrease the ohmic value of a printed resistor.

Because of the high inductance of coil 21, when the tip of probe 23 is brought into the vicinity of printed resistor 26 mounted on substrate 27, as shown in FIG. 5, a corona discharge D is developed between the probe tip and the point or zone on the resistor adjacent thereto. The resistive material which is irradiated by the corona discharge is subjected to an ionic action affecting its resistive characteristics.

XAs is well known, corona is the phenomenon of air breakdown when the electric stress at the surface of a conductor exceeds a certain value. At higher values, the stress results in a luminous discharge. At a still higher critical voltage value, sparkover occurs. In the present invention, the RF voltage level is such as to produce a luminous corona discharge.

The resistor is connected in the circuit of an ohmmeter 28 so that its value may be read as trimming is carried out. It has been found, for reasons which are not understood theoretically, that when a point or zone on the surface of a printed circuit resistor is subjected to a corona discharge, the resistive properties thereof are so affected as to cause a decrease in resistance without any perceptible physical change. The extent of this change at the point of irradiation depends on the duration of corona exposure, although as the discharge continues, the ohmic change tends to level off. However, since one ordinarily seeks to make only a slight change to bring a printed resistor from its initial value to within a predetermined tolerance, it is normally necessary to expose the resistor to only a brief period of corona discharge.

In practice, particularly when used in mass production, the system may be automated by an arrangement acting to switch off the corona discharge at the instant the resistor attains its precise value.

Figure 6:
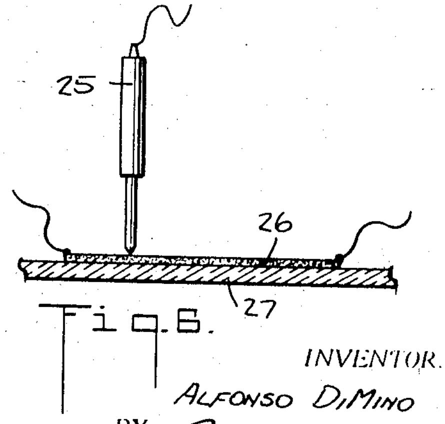
FIG. 6 shows how the value of the same resistor is increased by the apparatus.

Should it be necessary to increase the value of the printed resistor, then probe 25, as shown in FIG. 6, is brought into direct contact with a point on resistor 26. Since the single-turn coil coupled to this probe yields a relatively low voltage having a high current density, no corona is produced, but the resultant heating current which passes through the resistor brings about an upward change in resistance value. By observing this change on an ohmmeter, one may maintain probe contact or current flow until the desired resistor value is attained.

The effect of the "Up" and "Down" probe operations is reversible within certain limits, so that if one inadvertently overshoots the resistance value with one probe, it is possible to correct it with the other. Thus the invention virtually does away with rejections as a result of trimming and makes possible the economical and rapid production of printed resistors having precise values.

While there has been shown a preferred embodiment of the invention, it is to be understood that many changes and modifications may be made therein without departing from the essential spirit of the invention. Where, for example, a particular form of printed circuit having a network of resistors is to be produced on a large scale, one may provide therefor a multiprobe Xtesting jig so that each resistor in sequence may be quickly trimmed.

What I claim is:

1. An electronic technique for trimming the ohmic value of a microelectronic resistor printed on a substrate, the technique comprising the steps of:

A. generating radiofrequency energy including an audiofrequency amplitude-modulation component to render the energy effectively pulsatory in nature, B. applying the energy in high-voltage form to a first probe at a level sufficient to create a corona discharge, C. applying the energy in low voltage form to a second probe at a level sufficient to effect resistive heating, D. bringing the first probe into the proximity of a point on the resistor to create a corona discharge causing a decrease in resistance value, and E. bringing the second probe into contact with a point on the resistor to produce a heating current flow therein causing an increase in resistance value.

2. A technique as set forth in claim 1 wherein said radiofrequency energy is in the range of about 800 to 1,000 kilohertz.

3. A technique as set forth in claim 1 wherein said audiofrequency component is about 2,000 to 3,000 Hz.

4. A technique as set forth in claim 1, further including the steps of measuring the value of the resistor in the course of testing and cutting off said energy when the measured value is correct.